(12) United States Patent
Chang et al.

(10) Patent No.: US 11,107,797 B2
(45) Date of Patent: Aug. 31, 2021

(54) LIGHT-EMITTING DEVICE AND THE METHOD OF MANUFACTURING THE SAME

(71) Applicant: EPISTAR CORPORATION, Hsinchu (TW)

(72) Inventors: Jui-Hsien Chang, Hsinchu (TW); Been-Yu Liaw, Hsinchu (TW); Cheng-Nan Han, Hsinchu (TW); Min-Hsun Hsieh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 17/002,672

(22) Filed: Aug. 25, 2020

(65) Prior Publication Data
US 2021/0043610 A1 Feb. 11, 2021

Related U.S. Application Data

(63) Continuation of application No. 15/881,401, filed on Jan. 26, 2018, now Pat. No. 10,756,067, which is a (Continued)

(30) Foreign Application Priority Data

Dec. 13, 2013 (CN) .................. 201310684294.X

(51) Int. Cl.
*H01L 25/075* (2006.01)
*H05K 1/11* (2006.01)
(Continued)

(52) U.S. Cl.
CPC .......... *H01L 25/0753* (2013.01); *H01L 33/46* (2013.01); *H01L 33/505* (2013.01);
(Continued)

(58) Field of Classification Search
CPC ..... F21Y 2115/10; H05K 1/113; H05K 3/284; H05K 3/305; H05K 2201/10106; H05K 2201/10113; H05K 2201/2054
See application file for complete search history.

(56) References Cited

U.S. PATENT DOCUMENTS 6,733,711 B2 5/2004 Durocher et al.
7,518,150 B2 4/2009 Aihara
(Continued)

FOREIGN PATENT DOCUMENTS

CN 101872823 A 10/2010
CN 102024805 A 4/2011
(Continued)

*Primary Examiner* — Peggy A Neils
(74) *Attorney, Agent, or Firm* — Patterson + Sheridan, LLP

(57) ABSTRACT

The present application discloses a light-emitting device including a first support structure having a first surface, a plurality of light-emitting elements arranged on the first surface, and a first adhesive layer arranged on the first support structure. Each light-emitting element has a side wall, a bottom surface, a first electrode pad, and a second electrode pad arranged on the bottom surface. The first adhesive layer surrounds the side wall and does not directly contact the bottom surface. The first support structure includes a plurality of through holes located on positions corresponding to the first electrode pad and the second electrode pad.

10 Claims, 6 Drawing Sheets

Related U.S. Application Data continuation of application No. 14/567,318, filed on Dec. 11, 2014, now Pat. No. 9,917,075.

(51) Int. Cl.
| | |
|---|---|
| *H05K 3/28* | (2006.01) |
| *H05K 3/30* | (2006.01) |
| *H01L 33/46* | (2010.01) |
| *H01L 33/50* | (2010.01) |
| *H01L 33/62* | (2010.01) |

(52) U.S. Cl.
CPC .... *H01L 33/62* (2013.01); *H01L 2224/16225* (2013.01); *H05K 1/113* (2013.01); *H05K 3/284* (2013.01); *H05K 3/305* (2013.01); *H05K 2201/10106* (2013.01); *H05K 2201/10113* (2013.01); *H05K 2201/2054* (2013.01); *H05K 2203/1461* (2013.01)

(56) References Cited

U.S. PATENT DOCUMENTS

| | | | |
|---|---|---|---|
| 7,528,077 B2 | 5/2009 | Izuno et al. | |
| 7,696,522 B2 | 4/2010 | Ono et al. | |
| 8,143,777 B2 | 3/2012 | Takano | |
| 8,258,620 B2 | 9/2012 | Nakasato et al. | |
| 8,455,895 B2 * | 6/2013 | Chai | H01L 25/0753 |
| | | | 257/98 |
| 8,491,140 B2 | 7/2013 | Van De Ven et al. | |
| 8,616,732 B2 | 12/2013 | Shibusawa et al. | |
| 8,765,500 B2 | 7/2014 | Tseng et al. | |
| 8,894,245 B2 | 11/2014 | Suehiro et al. | |
| 8,957,428 B2 * | 2/2015 | Jagt | H01L 33/46 |
| | | | 257/88 |
| 9,065,033 B2 | 6/2015 | Lee et al. | |
| 9,099,333 B2 | 8/2015 | Imamura et al. | |
| 9,232,573 B2 | 1/2016 | Miyashita | |
| 9,269,873 B2 | 2/2016 | Imazu et al. | |
| 9,324,926 B2 | 4/2016 | Schricker et al. | |
| 9,570,424 B2 | 2/2017 | Nam et al. | |
| 9,810,381 B2 | 11/2017 | Togawa | |
| 9,871,167 B2 | 1/2018 | Moran et al. | |
| 2012/0181562 A1 | 7/2012 | Lee et al. | |
| 2012/0261689 A1 | 10/2012 | Appelt et al. | |
| 2014/0151734 A1 | 6/2014 | Ito et al. | |
| 2015/0316215 A1 | 11/2015 | Togawa | |
| 2016/0133803 A1 | 5/2016 | Bierhuizen | |

FOREIGN PATENT DOCUMENTS

| | | |
|---|---|---|
| CN | 102208401 A | 10/2011 |
| JP | 2001237462 A | 8/2001 |
| WO | WO-2013011628 A1 | 1/2013 |

\* cited by examiner

LIGHT-EMITTING DEVICE AND THE METHOD OF MANUFACTURING THE SAME

RELATED APPLICATION

This application a continuation application of U.S. patent application Ser. No. 15/881,401, entitled "LIGHT-EMITTING DEVICE AND THE METHOD OF MANUFACTURING THE SAME", filed on Jan. 26, 2018 which is a continuation application of U.S. patent application Ser. No. 14/567,318, entitled "LIGHT-EMITTING DEVICE AND THE METHOD OF MANUFACTURING THE SAME", filed on Dec. 11, 2014 which claims priority to China Patent Application Serial No. 201310684294.X, filed on Dec. 13, 2013, entitled as "LIGHT-EMITTING DEVICE AND THE METHOD OF MANUFACTURING THE SAME", and the content of which is hereby incorporated by reference in its entirety.

TECHNICAL FIELD

The present disclosure relates to a light-emitting device and in particular to a light-emitting device having a supporting structure with through holes.

DESCRIPTION OF THE RELATED ART

Light-emitting device using light-emitting diode (LED) is gradually taking the place of traditional incandescent light because the LED is energy saving, environmental friendly, long life time, compact, and so on. Various light emitting devices, such as a device using a single or multiple chips as a light source, are developed in this trend.

Among the related technologies of using multiple LED chips as a light source, there is one called white light-emitting diode (WLED), which utilizes blue chip(s) and red chip(s) as light sources in accompany with phosphor for producing a mixed white light. In such structure, because of the limited space, the light emitted from each chip or excited from the phosphor pass through the phosphor again so the light wavelength irradiated by the light-emitting device is biased from the predetermined range, regardless phosphor is mounted on the chip (local) or far from the chip (remote). Because of such narrow space, the neighboring light-emitting sources are interfered with each other, and the original light field design is affected. To solve those problems, the manufacturer can increase the inner space of the light-emitting device, change the position of the chip, or add a light guide in the light-emitting device. Nevertheless, the fabrication cost and the size of the light-emitting device are definitely affected.

Besides, a multi-chip light-emitting device commonly has a problem of complex fabrication process. As mentioned above, to place multiple chips in such a narrow space, one has to consider several issues such as heat dissipation, the influence on the light field, or circuit design. Therefore, it is important to consider the light field and fabrication cost resulted from the narrow space and complex fabrication of multi-chip light-emitting device.

SUMMARY OF THE DISCLOSURE

A light-emitting device includes a first supporting structure having a first surface, a second surface opposite to the first surface, a plurality of light-emitting elements arranged on the first surface. Each of the plurality of light-emitting elements has a side wall, a bottom surface, a first electrode pad arranged on the bottom surface, and a second electrode pad arranged on the bottom surface. A first adhesive layer is arranged on the first supporting structure and surrounds the side wall.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed. It is noted that the elements not drawn or described in the figure can be included in the present application by the skilled person in the art.

Figure 1:
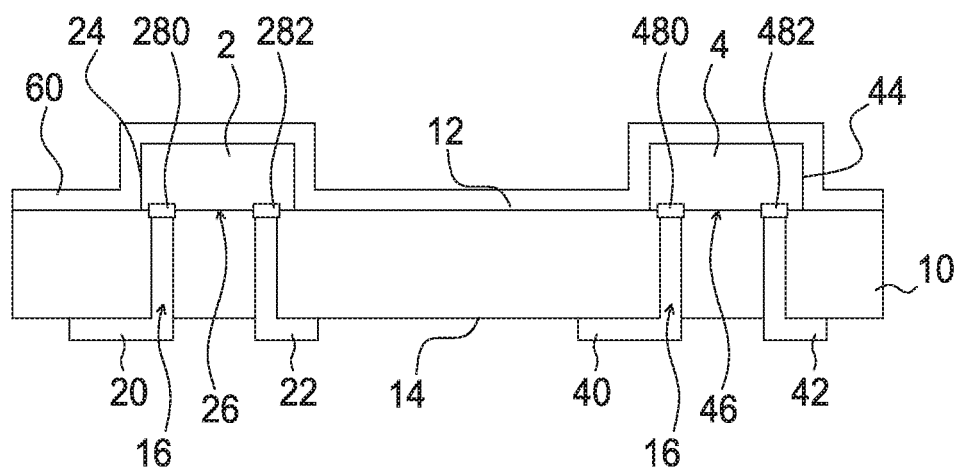
FIG. 1 shows a side view of a light-emitting device in accordance with an embodiment of the present disclosure.

FIG. 1 shows a side view of the first embodiment in accordance with the present disclosure. A light-emitting device 100 includes a first supporting structure 10 which includes a first surface 12, a second surface 14, and through holes 16 extending from the first surface 12 to the second surface 14. A first light-emitting element 2 and a second light-emitting element 4 are arranged on the first surface 12. The first light-emitting element 2 includes two electrode pads 280, 282 which are formed on the bottom surface 26 and connected to conductive structures 20, 22 respectively. The conductive structures 20, 22 extend from the first surface 12 to the second surface 14 via the through holes 16. The second light-emitting element 4 includes two electrode pads 480,482 which are formed on the bottom surface 46 and connected to conductive structures 40, 42 respectively. The conductive structures 40, 42 extend from the first surface 12 to the second surface 14 via the through holes 16. Furthermore, the first light-emitting element 2 and the second light-emitting element 4 can emit incoherent lights with identical, different, or similar dominant wavelengths. In present embodiment, each of the through holes 16 is arranged in a position corresponding to that of electrode pads of the light-emitting element in the first supporting structure 10. The first light-emitting element 2 and the second light-emitting element 4 have side walls 24 and 44, respectively. The side walls 24 and 44 are covered by the first adhesive layer 60. However, the first adhesive layer 60 does not cover the bottom surfaces 26, 46 of the light-emitting elements 2, 4 but covers the side walls 24, 44 and the other surfaces opposite to the bottom surfaces 24, 46 of the light-emitting elements. Further, the first adhesive layer 60 does not contact the electrode pads 280, 282, 480, 482. The through holes 16 have not only the conductive structures 20, 22, 40, 42 formed therein but also an intermediate layer (not shown) which is placed between the conductive structures 20, 22, 40, 42, and the first supporting structure 10 for enhancing the adhesion between the conductive structure and the first supporting structure, wherein the conductive structures 20, 22, 40, 42, are used to connect to an external control circuit. Therefore, in one embodiment, the lighting states of the first light-emitting element 2 and the second light-emitting element 4 can be controlled by external control circuits separately. In one embodiment, the shortest distance between the first light-emitting element 2 and the second light-emitting element 4 is the shortest distance between the respective side walls 24, 44 of the nearby light-emitting elements, which is less than about 10 mm, such as 1 mm, 3 mm, or 7 mm. In another embodiment, the shortest distance between the first light-emitting element 2 and the second light-emitting element 4 is less than about 1 mm, such as 0.5 mm, 0.3 mm, or 0.1 mm. However, the distance can be changed according to different applications.

Figure 2A:
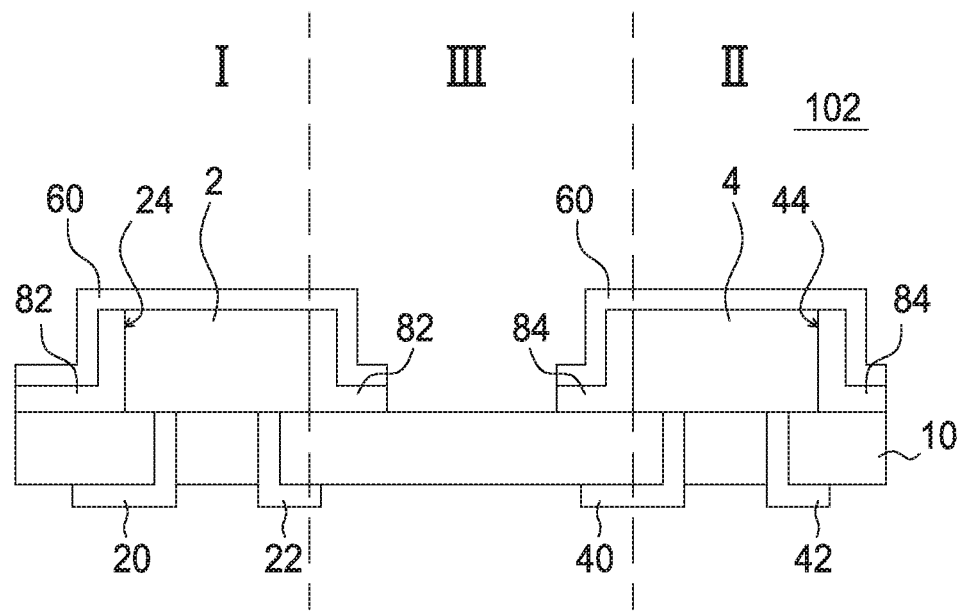
FIGS. 2a-2b show side views of a light-emitting device in accordance with an embodiment of the present disclosure.
Figure 2B:
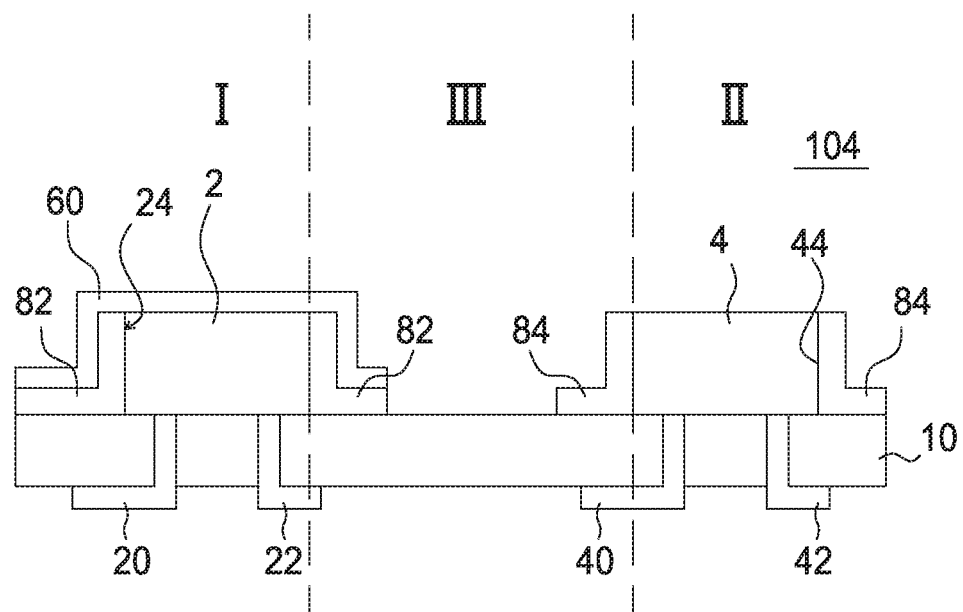

Referring to FIGS. 2a-2b, the light-emitting device 102 can be approximately separated into three areas. As shown in FIG. 2a, in this embodiment, the first light-emitting element 2 is located in the area I, the second light-emitting element 4 is located in the area II, and the area III located between area I and area II is not covered by the light-emitting element. The first reflecting layer 82 is placed between the side wall 24 and the first adhesive layer 60, and the second reflecting layer 84 is placed between the side wall 44 and the first adhesive layer 60. In this embodiment, the first adhesive layer 60, the first reflecting layer 82, and the second reflecting layer 84 are not connected to each other in area III. In other embodiment, the first reflecting layer 82 is connected to the second reflecting layer 84 in area III. The first adhesive layer 60 extends from area I to area II through area III. In some other embodiments, the first reflecting layer 82 is connected to the second reflecting layer 84 in area III while the first adhesive layers 60 located in area I and area II are not connected to each other in area III, so that a part of the first reflecting layer 82 and a part of the second reflecting layer 84 are not covered by the first adhesive layer 60. In other embodiment, the first reflecting layer 82 and the second reflecting layer 84 are not connected to each other in area III while the first adhesive layers 60 located in area I and area II are connected to each other in area III, that is, in the light-emitting device 102, the first adhesive layer 60 directly contacts the first supporting structure 10 in some area without the first reflecting layer 82 or the second reflecting layer 84 placed between the first adhesive layer 60 and the first surface 12 of the supporting structure. The first reflecting layer 82 and the second reflecting layer 84 changes the light paths emitted from the light-emitting elements 2, 4 respectively, so that the light emitted from both of light-emitting elements do not affect each other. Referring to FIG. 2b, in this embodiment, for the light-emitting device 104, only the first light-emitting element 2 in area I is covered by the first adhesive layer 60 while area I, area II and area III are not covered by the first adhesive layer 60 at the same time. Or, only the second light-emitting element 4 is covered by the first adhesive layer 60, i.e. the first adhesive layer 60 covers only area II. In addition, the first reflecting layer 82 and the second reflecting layer 84 can be optionally connected with each other as well. Moreover, the connected portion is still not covered by the first adhesive layer 60. In an embodiment shown in FIG. 2a, the light emitted from two light-emitting elements is affected by the reflecting layers 82, 84, so that the light passes through the first adhesive layer 60 and moves in a direction away from the first supporting structure 10. In an embodiment shown in FIG. 2b, the light also moves in a direction far away from the first supporting structure 10. However, only the light emitted from the first light-emitting element 2 can pass through the first adhesive layer 60. In other embodiment, if the first supporting structure 10 is transparent to the light emitted from the first light-emitting element 2 or the second light-emitting element 4, the light will move in a direction toward the first supporting structure 10.

In further embodiment, the light-emitting devices 100, 102, and 104 are covered by the first adhesive layer 60 which can include a wavelength conversion material. The light emitted from the light-emitting element can be changed by the wavelength conversion material, and the light mixing is therefore fulfilled. In addition, an optical brighter, such as $TiO_2$, can be optionally added into the adhesive layer 60 to increase light output of the light-emitting device. The area covered by first adhesive layer 60 is where the wavelength conversion material is placed. The first adhesive layer 60 can cover the whole first surface 12 of the first supporting structure 10, as shown in FIG. 1. Otherwise, the first adhesive layer 60 can cover the first light-emitting element 2 and the second light-emitting element 4, and extend to the first reflecting layer 82 and the second reflecting layer 84 without covering the whole first surface 12, that is, at least one area is not covered by the first adhesive layer 60, as shown in FIG. 2a. The first adhesive layer 60 can cover only the first light-emitting element 2 and extends to the first reflecting layer 82 without covering the second light-emitting element 4, as shown in FIG. 2b. In other embodiment, the wavelength conversion materials included in the adhesive layer can be the same or different, that is, that wavelength conversion material, such as phosphor, can be varied with the light-emitting element sought to be covered. Taking FIG. 2a as an example, the first adhesive layer 60 disposed on the first light-emitting element 2 has a first phosphor, and the first adhesive layer 60 disposed on the second light-emitting element 4 has a second phosphor. Therefore, the light-emitting device 102 has two kinds of phosphors able to be excited to generate lights with identical, different, or similar colors. For example, the first light-emitting element 2 is a blue chip, and the second light-emitting element 4 is a UV chip. The first adhesive layer 60 covering the first light-emitting element 2 includes a phosphor which can absorb a blue light and emit a red light. The first adhesive layer 60 covering the second light-emitting element 4 includes a phosphor which can absorb a UV light and emit a red light. The light-emitting device 102 can then emit a white light. Taking the FIG. 2b as an example, only one of the first light-emitting element 2 or the second light-emitting element 4 is covered by the first adhesive layer 60, that is, only one light-emitting element excites the phosphor. For example, the first light-emitting element 2 is a blue chip and covered by a phosphor which can emit a red light, and the second light-emitting 4 is selected to use a red chip when considering the optical characteristics, such as a stable color temperature or light intensity in the thermal state for generating a white light from the light-emitting device 104. In other embodiment, light-emitting elements are arranged on the first supporting structure 10; the light-emitting elements include a first group and a second group, wherein the light-emitting elements belonging to the first group are covered by the first adhesive layer which includes the first wavelength conversion material. The light-emitting elements belonging to the second group can be optionally covered by the first adhesive layer. Specifically, blue chips can be formed on the first supporting structure 60 as light-emitting devices, wherein the blue chips of the first group are covered by a red-light phosphor (the first wavelength conversion material), the blue chips of the second group are covered by a green-light phosphor (the second wavelength conversion material). The lights emitted from the first group and the second group can be mixed to produce white light. Otherwise, some blue chips not belonging to the first group and the second group are not covered by the phosphor and can independently produce a blue light. Therefore, the light-emitting device can separately provide red light, blue light, green light, or mixed white light. Moreover, by separately adjusting red light, blue light and green light, larger color gamut can be achieved. In addition, in other embodiment, the adhesive layer covering the light-emitting elements can exclude phosphor. For example, the light-emitting elements including blue chip(s) and red chip(s) also can produce a mixed white light.

Figure 3A:
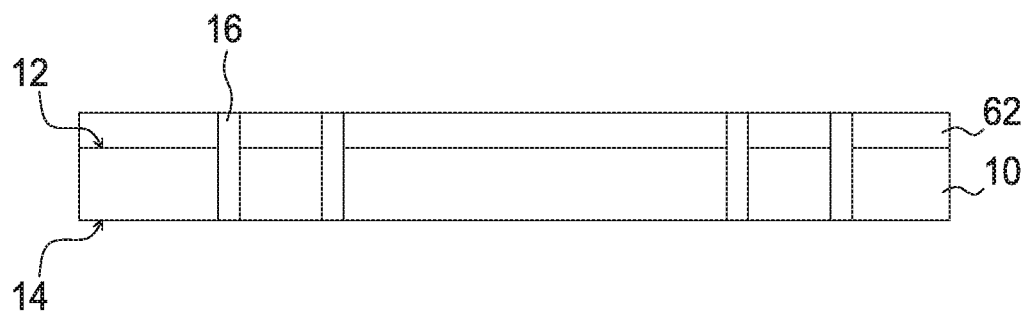
FIGS. 3a-3d show a manufacturing process flows of a light-emitting device in accordance with an embodiment of the present disclosure.
Figure 3B:
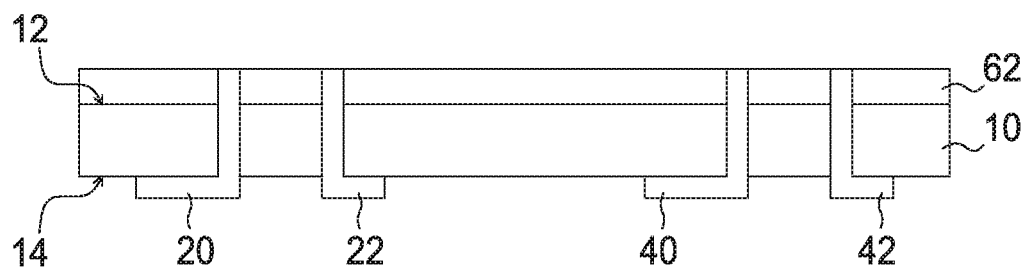
Figure 3C:
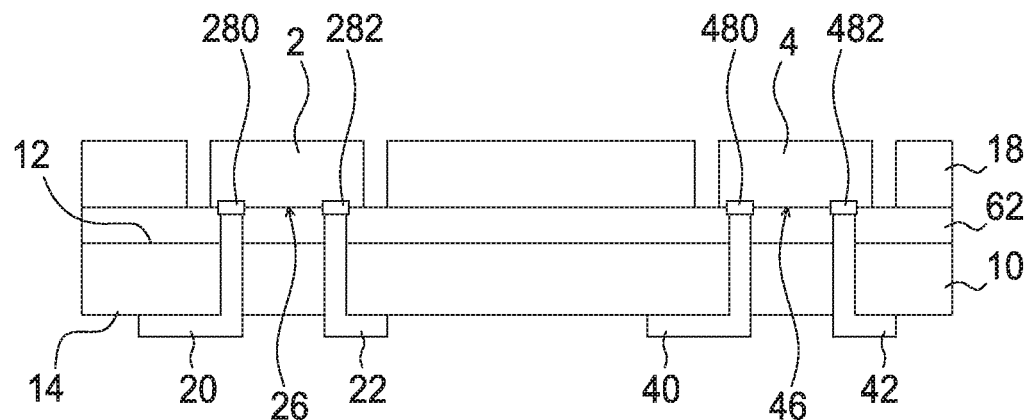
Figure 3D:
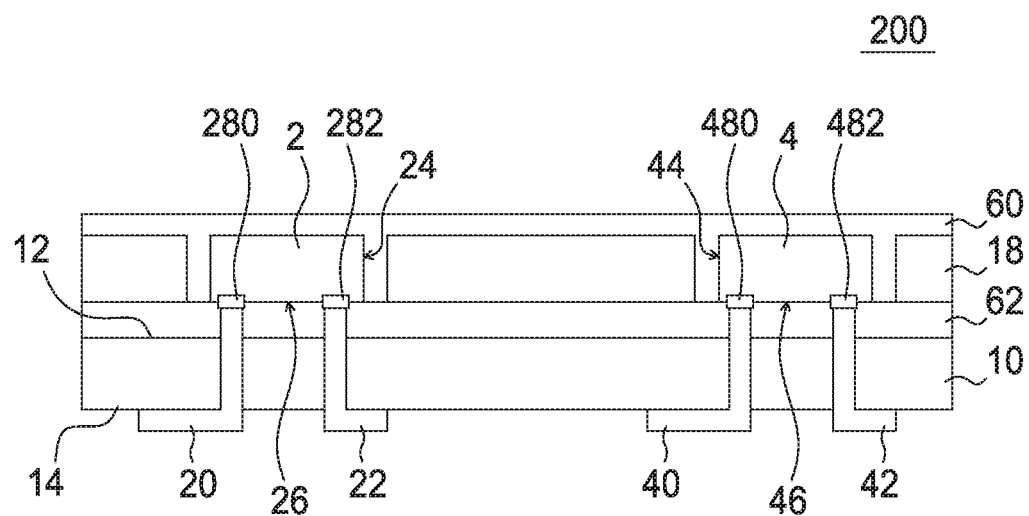

FIGS. 3a-3d show a manufacturing process in accordance with an embodiment of the present disclosure. The first supporting structure 10 and the second adhesive layer 62 are provided at first, then through holes 16 are formed to penetrate through the first surface 12 of the first supporting structure 10, the second surface 14 of the first supporting structure 10, and the second adhesive layer 62, as shown in FIG. 3a. After completing through holes 16, as shown in FIG. 3b, the conductive material, such as metal, is filled into the through holes 16 to form the conductive structures 20, 22, 40 and 42. In other embodiment, the inner surface of through holes 16 can be covered by a filler layer, such as resin (not shown), by plating in order to further smooth the inner surface of through holes 16 so the conductive material filled in following filling step(s) can be denser. If the first supporting structure 10 is a conductive material, an insulating material is selected to be the filling material; if the first supporting structure 10 is an insulating material, a conductive or insulating material is selected to be the filling material. The conductive structures 20, 22, 40 and 42 are not only filled in the through holes 16 but also extended on the second surface 14 for electrically connecting the light-emitting devices formed later with exterior circuit(s) (not shown). Referring to FIG. 3c, the second supporting structure 18 is formed on the second adhesive layer 62. Some of the second supporting structure 18 is then removed for placing the first light-emitting element 2 and the second light-emitting element 4, so that the light-emitting elements can connect to the first supporting structure 10 by the second adhesive layer 62. The conductive structures 20, 22, 40, 42 are electrically connected to the electrode pads 280, 282 located on the bottom surface 26 of the first light-emitting element 2 and the electrode pads 480, 482 located on the bottom surface 46 of the second light-emitting element 4, respectively. In other embodiment, the first light-emitting element 2 and the second light-emitting element 4 do not have the electrode pads. In such case, the conductive structures are electrically connected to conductive zones which are located on the bottom surface 26, 46 of the light-emitting elements 2, 4. The conductive structures are therefore electrically connected to the circuit structure (not shown) located on the second surface 14 to control the light-emitting elements for separately or simultaneously emitting an incoherent light with identical, different or similar dominant wavelengths. Referring to FIG. 3d, the first adhesive layer 60 further covers the first light-emitting element 2 and the second light-emitting element 4 to form the light-emitting device 200, wherein the first adhesive layer 60 is further filled in the gap between the second supporting structure 18 and light-emitting elements. The first adhesive layer 60 is therefore arranged to cover the side wall 24 of the first light-emitting element 2 and the side wall 44 of the second light-emitting element 4 respectively. In present embodiment, the material of the second supporting structure 18 can be the same as or different from the material of the first supporting structure 10. The second supporting structure 18 can prevent the lights emitted from the first light-emitting element 2 and the second light-emitting element 4 from interfering with each other and obtain a better light field distribution. If the first adhesive layer 60 includes a wavelength conversion material (such as phosphor), the second supporting structure 18 can prevent the light which comes from a phosphor excited by light emitted from the second light-emitting element 2 from being absorbed by the phosphor located on the side wall 44 and from being absorbed by the second light-emitting element 4. The luminous efficiency decay is hence avoided.

Figure 4A:
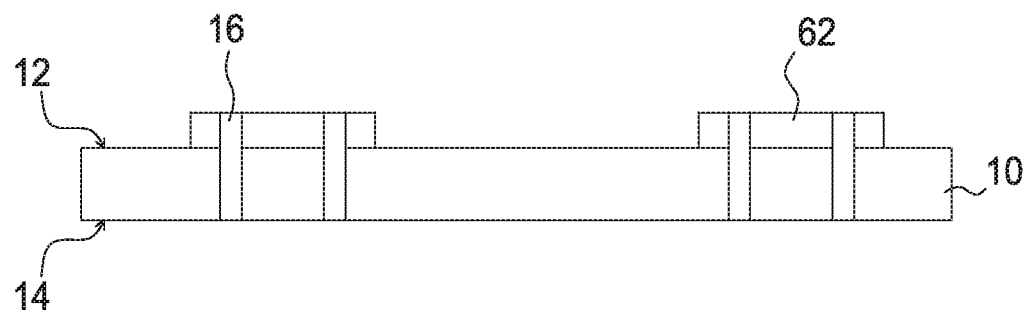
FIGS. 4a-4d show a manufacturing process flows of a light-emitting device in accordance with an embodiment of the present disclosure.
Figure 4B:
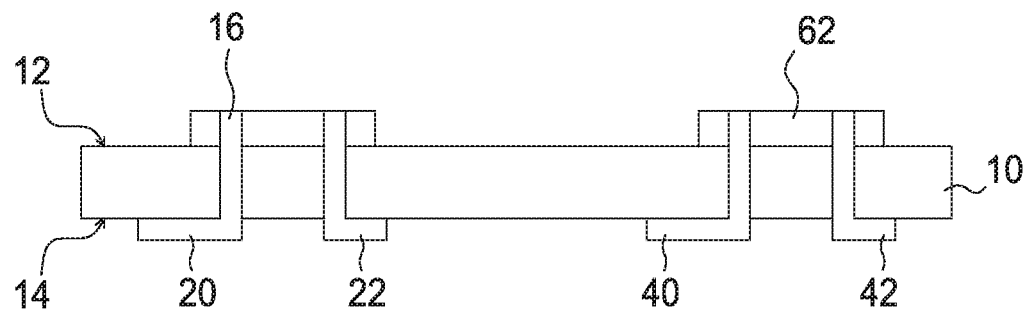
Figure 4C:
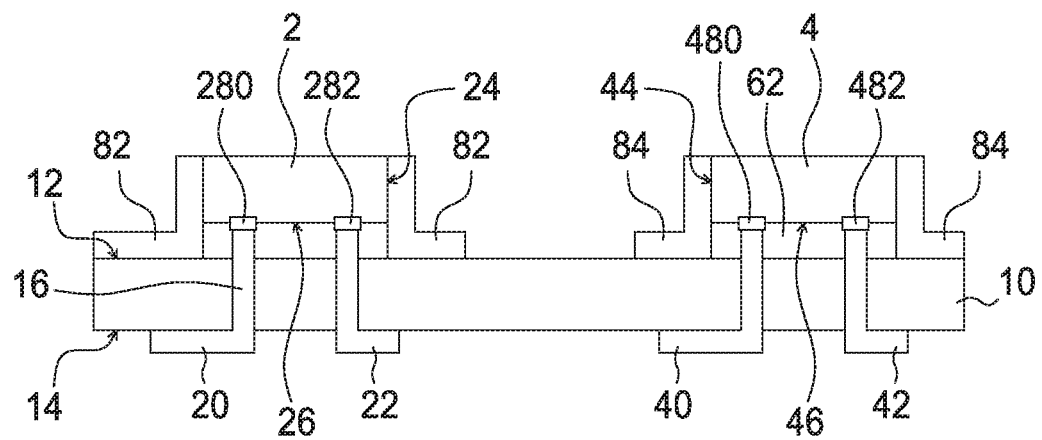
Figure 4D:
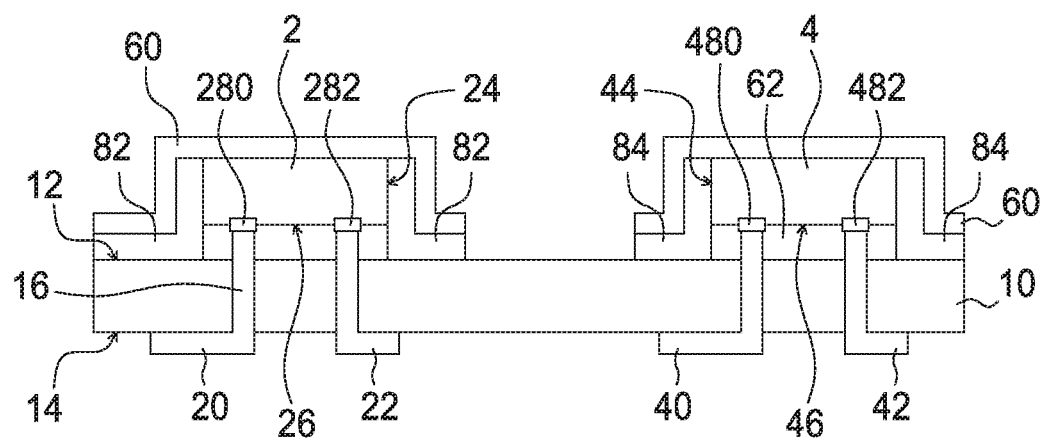

FIGS. 4a-4d show the manufacturing process in accordance with an embodiment of the present disclosure. The first supporting structure 10 and the second adhesive layer 62 are provided at first, through holes 16 is formed to penetrate through the first supporting structure 10. After penetrating through the first surface 12 and the second surface 14, the through holes then penetrate through the second adhesive layer 62, as shown in FIG. 4a. Wherein the second adhesive layer 62 does not cover the whole first surface 12, but covers only part of the first surface 12, so that the through holes 16 only locate in the area covered by the second adhesive layer 62. As shown in FIG. 4b, the conductive material, such as metal, is filled in the through holes 16 to form the conductive structures 20, 22, 40 and 42. In other embodiment, the inner surface of through holes 16 can be covered by a filler layer, such as resin (not shown), by plating in order to further smooth the inner surface of through holes 16 so the conductive material formed in following filling step(s) can be denser. The conductive structures 20, 22, 40 and 42 are not only filled in the through holes 16 but also extended on the second surface 14 for electrically connecting the other light-emitting devices and exterior circuits (not shown). Referring to FIG. 4c, the two light-emitting elements 2, 4 are connected to the first supporting structure through the respective bottom surfaces 26, 46 and the second adhesive layer 62 located between light-emitting elements and the first supporting structure. Each second adhesive layer 62, which is located between two light-emitting elements and the first supporting structure 10, is not connected to other second adhesive layer 62. The side wall 24 of the first light-emitting element 2 is then covered by the reflecting layer 82, and the side wall 44 of the second light-emitting element is covered by the reflecting layer 84. Moreover, the two reflecting layers are not directly connected to each other. The conductive structures 20, 22, 40, 42 are electrically connected to the electrode pads 280, 282 located on the bottom surface 26 of the first light-emitting element 2 and the electrode pads 480, 482 located on the bottom surface 46 of the second light-emitting element 4, respectively. Moreover the positions of the electrode pads of the light-emitting element are corresponding to the positions of through holes. In other embodiment, the first light-emitting element 2 and the second light-emitting element 4 do not have the electrode pads. In such case, the conductive structures are electrically connected to the conductive zones which are located on the bottom surfaces 26, 46 of the light-emitting elements 2, 4. The conductive structures are therefore electrically connected to the circuit structure (not shown) which is located on the second surface 14 to control the light-emitting elements for separately or simultaneously emitting an incoherent light with identical, different, or similar dominant wavelengths. Referring to FIG. 4d, the first adhesive layer 60 further covers the first light-emitting element 2 and the second light-emitting element 4 to form the light-emitting device 300. The first adhesive layer 60 located on the first light-emitting element 2 is not connected to the other one located on the second light-emitting element 4. In present embodiment, the first adhesive layer and reflecting layer located on respective light-emitting element are not connected to each other. In other embodiment, the first adhesive layer and reflecting layer located on one light-emitting element can be separately or simultaneously connected to the first adhesive layer and reflecting layer located on another light-emitting element. Therefore, in one embodiment, the reflecting layers of the first light-emitting element 2 and the second light-emitting element 4 are connected to each other while the first adhesive layers of the first light-emitting element 2 and the second light-emitting element 4 are not connected to each other. However, in other embodiment, both the reflecting layers and adhesive layers of the first light-emitting element 2 and the second light-emitting element 4 are connected to each other. In other embodiments, light-emitting elements are located on the first supporting structure. The first adhesive layers and the reflecting layers of some light-emitting elements are not connected to each other while only the first adhesive layers or only the reflecting layers of other light-emitting elements are connected to each other. In a light-emitting device, all of the first adhesive layers and the reflecting layers of the light-emitting elements can be simultaneously connected to or separated from each other. In other cases, only the first adhesive layers or only the reflecting layers are connected to or separated from each other, or the first adhesive layers and the reflecting layers of some light-emitting elements are connected to or separated from each other. In present embodiment, the reflecting layers can prevent the lights emitted from the first light-emitting element 2 and the second light-emitting element 4 from interfering with each other and obtain a better light field distribution. If the first adhesive layer 60 includes a wavelength conversion material, such as phosphor, it is beneficial to prevent the light which comes from one phosphor excited by light emitted from one light-emitting element from being absorbed by another phosphor located on another light-emitting element, or being absorbed by another light-emitting element. Either kind of absorption can results in decay of the luminous efficiency.

Referring to the light-emitting device 200 shown in FIG. 3d and the light-emitting device 300 shown in FIG. 4d, various light-emitting devices can be made by combining the characteristics of manufacturing methods shown in FIGS. 3a-3d and FIGS. 4a-4d. As shown in FIG. 3c, after connecting the second supporting structure 18 and the first supporting structure 10, the reflecting layer is firstly formed between the light-emitting device and the second supporting structure 18, and the first adhesive layer 60 is then covered and filled into the gap within the second supporting structure 18, as the steps shown in FIG. 3d. In this embodiment, the first adhesive layer 60 can be placed between the light-emitting element and the reflecting layer, or between the reflecting layer and the second supporting structure 18. Otherwise, as shown in FIG. 4c, the light-emitting element and the reflecting layer can be firstly arranged in the gap of the second supporting structure 18 and then connected to the first supporting structure 10 while the second adhesive layer 62 still covers part of the first surface 12. Besides, the light-emitting device can be covered by an optical element, such as an optical element with reflecting material, to change the light field distribution.

In above embodiment, the thickness of the first supporting structure 10 and/or the second supporting structure 18 can be 60 μm or between 100 μm~200 μm, depending on the manufacture process, the density, and the required supporting strength of the through holes 16. The manufacturing method of the through holes 16 which penetrates the first supporting structure 10 can be a physical or chemical methods, for example, physical drilling that removes a part of the supporting structure to form the through holes 16 by laser dry etching, or forming the same by chemical wet etching. In present embodiment, the supporting structure can be made of organic material such as novolak, epoxy, polyimide or bismaleimide-trazine resin (BT resin), or inorganic material such as glass fiber, aluminum or ceramic material. In present embodiment, a material with glass transition temperature of more than 200° C., such as Bismaleimide-trazine resin(BT resin) with glass transition temperature between 255° C.~330° C., can be selected to prevent the damage resulted from the embrittled first supporting structure which is caused by the high temperature occurred during filling the through holes or forming the conductive structure. A high thermal resistant material, such as a material which can sustain a process operated at a temperature of 150° C. without being distorted or damaged, or a material which can sustain a manufacturing process operated at a temperature of 160, 200, 230° C. or higher, can also be adopted. A material with better moisture resistance and low dielectric constant can be optionally used in the supporting structure to prevent the light-emitting device from the influence caused by external environment, and the durability is therefore enhanced. In the embodiments, the adhesive layer can be arranged to cover all or parts of the supporting structure surface by coating, glue dispensing, or injection molding.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed:
1. A light-emitting device, comprising:
  a supporting structure having a top surface;
  a plurality of conductive structures passing through the supporting structure;
  a first light-emitting element arranged on the supporting structure, and having a first width and a plurality of first side walls;
  a second light-emitting element having a second width and a plurality of second side walls, and arranged on the supporting structure in a configuration of separating from the first light-emitting element by a first distance which is larger than the first width or the second width;
  a layer comprising at least one kind of wavelength conversion materials, and covering the first light-emitting element, the second light-emitting element, and a portion of the top surface, wherein the portion is not overlapped with the first light-emitting element and the second light-emitting element; and
  a first reflecting layer contacting the plurality of first side walls,
  wherein the plurality of conductive structures is arranged right under the first light-emitting element and the second light-emitting element.

2. The light-emitting device according to claim 1, wherein the first reflecting layer is placed between the plurality of first side walls and the layer.

3. The light-emitting device according to claim 1, further comprising a second reflecting layer contacting the plurality of second side walls and separated from the plurality of first side walls.

4. The light-emitting device according to claim 3, wherein the layer is placed between the first reflecting layer and the second reflecting layer.

5. The light-emitting device according to claim 1, wherein the first reflecting layer has a third width smaller than the first width.

6. The light-emitting device according to claim 1, wherein the layer directly contacts the supporting structure.

7. The light-emitting device according to claim 1, wherein the first light-emitting element and the second light-emitting element emit a blue light under operation.

8. The light-emitting device according to claim 1, wherein the layer has a first portion covering the first light-emitting element, and a second portion covering the second light-emitting element.

9. The light-emitting device according to claim 8, wherein the first portion is separated from the second portion.

10. The light-emitting device according to claim 9, wherein the first portion has a first kind of wavelength conversion material, and the second portion has a second kind of wavelength conversion material different from the first kind of wavelength conversion material of the first portion.

* * * * *